(12) United States Patent
Lee

(10) Patent No.: US 11,302,493 B2
(45) Date of Patent: Apr. 12, 2022

(54) BUTTON ASSEMBLY AND CONTROLLER INCLUDING THE SAME

(71) Applicant: Cheng Uei Precision Industry Co., Ltd., New Taipei (TW)

(72) Inventor: Tsung-Shih Lee, New Taipei (TW)

(73) Assignee: CHENG UEI PRECISION INDUSTRY CO., LTD., New Taipei (TW)

( * ) Notice: Subject to any disclaimer, the term of this patent is extended or adjusted under 35 U.S.C. 154(b) by 31 days.

(21) Appl. No.: 16/660,783

(22) Filed: Oct. 22, 2019

(65) Prior Publication Data

US 2020/0219674 A1 Jul. 9, 2020

(30) Foreign Application Priority Data

Jan. 4, 2019 (CN) .......................... 201920016116.2

(51) Int. Cl.
*H01H 3/12* (2006.01)
*H05K 1/11* (2006.01)
*H01H 13/705* (2006.01)

(52) U.S. Cl.
CPC ............ *H01H 3/12* (2013.01); *H01H 13/705* (2013.01); *H05K 1/118* (2013.01); *H05K 2201/10151* (2013.01)

(58) Field of Classification Search
CPC .. H01H 3/12; H01H 13/705; H01H 2221/018; H05K 1/118; H05K 2201/10151; H05K 2201/09063; H05K 1/18; H05K 2201/09027; H05K 1/11; H03K 2217/9651; H03K 17/965
USPC .......................................... 200/343, 339, 553
See application file for complete search history.

(56) References Cited

U.S. PATENT DOCUMENTS

| 4,528,428 | A | * | 7/1985 | Gotoh | .................... | H01H 13/84 |
| | | | | | | 200/5 A |
| 8,884,715 | B2 | * | 11/2014 | Mu | .......................... | H03H 7/42 |
| | | | | | | 333/25 |
| 10,857,453 | B2 | * | 12/2020 | Tseng | ....................... | A63F 13/24 |
| 2020/0233447 | A1 | * | 7/2020 | Tseng | ....................... | G05G 1/02 |
| 2020/0243283 | A1 | * | 7/2020 | Tseng | ....................... | G05G 1/02 |

* cited by examiner

*Primary Examiner* — Lheiren Mae A Caroc
(74) *Attorney, Agent, or Firm* — Cheng-Ju Chiang

(57) ABSTRACT

A button assembly includes a pedestal, a pressure sensor module and a key cap. The pedestal has an accommodating groove penetrating upward through a top surface of the pedestal. Two opposite sides of the pedestal protrude oppositely outward to form a lower active portion and a lower pivot portion. The pressure sensor module is mounted in the accommodating groove. The key cap is covered on the pressure sensor module. A bottom surface of the key cap has a contact portion contacting with the pressure sensor module. Two opposite sides of the key cap protrude oppositely outward to form an upper active portion and an upper pivot portion. The upper pivot portion rotate pivoting the lower pivot portion, the upper active portion moves downward and upward with respect to the lower active portion.

18 Claims, 6 Drawing Sheets

BUTTON ASSEMBLY AND CONTROLLER INCLUDING THE SAME

CROSS-REFERENCE TO RELATED APPLICATION

The present application is based on, and claims priority from, China Patent Application No. 201920016116.2, filed Jan. 4, 2019, the disclosure of which is hereby incorporated by reference herein in its entirety.

BACKGROUND OF THE INVENTION

1. Field of the Invention

The present invention generally relates to a button assembly, and more particularly to a modular button assembly, and a controller including the button assembly.

2. The Related Art

A conventional controller includes a top cover, a button assembly and a pressure sensor. The pressure sensor realizes a pressure sensing function by virtue of a pressure sensing element or charges of a flexible printed circuit board. When a force exerted by a finger on the pressure sensor is larger, a pressed area of the pressure sensor is larger, the flexible printed circuit board will sense pressure signals and convert the pressure signals into digital signals, and then the digital signals are converted into pressure force values. When the conventional controller is assembled, the top cover is covered to the button assembly, and the pressure sensor is assembled under the top cover. When a user uses the conventional controller, the user will press the button assembly, the button assembly will be pressed downward to contact with a top surface of the pressure sensor in advance and then the pressure sensor is further pressed downward for completing pressing the button assembly.

However, in order to introduce the pressure sensor which is made of a soft foam material, the pressure sensor which is made of the soft foam material has a stronger sensing sensitivity. Therefore, in the above-mentioned configuration of the conventional controller, when the button assembly is pressed, the conventional controller is easily affected by accumulated tolerances among structures of the conventional controller to cause values to be overly changed. Moreover, if the button assembly is broken, the broken button assembly is hardly distinguished to be caused by the pressure sensor or other structures and the broken button assembly is difficult to be changed.

Thus, it is essential to provide an innovative modular button assembly, and an innovative controller including the innovative button assembly, the innovative button assembly includes a pressure sensor which is made of the soft foam material, so that when the pressure sensor which is made of the soft foam material is in use, the innovative button assembly may have less accumulated tolerances, and the innovative button assembly can be easily detected and replaced in the innovative controller.

SUMMARY OF THE INVENTION

An object of the present invention is to provide a button assembly adapted for being mounted in a controller. The button assembly includes a pedestal, a pressure sensor module and a key cap. A middle of the pedestal has an accommodating groove penetrating upward through a top surface of the middle of the pedestal. Two opposite sides of the pedestal protrude oppositely outward to form a lower active portion and a lower pivot portion. The pressure sensor module is mounted in the accommodating groove of the pedestal. The key cap is covered on the pressure sensor module. A bottom surface of the key cap has a contact portion contacting with the pressure sensor module. Two opposite sides of the key cap protrude oppositely outward to form an upper active portion and an upper pivot portion, respectively. The upper active portion is movably fastened to the lower active portion to form a movable active assembly. The upper pivot portion and the lower pivot portion are pivotally fastened with each other to form a pivot assembly. In processes of pressing and releasing the key cap, the upper pivot portion rotate pivoting the lower pivot portion, the upper active portion of the active assembly move downward and upward with respect to the lower active portion.

Another object of the present invention is to provide a controller. The controller includes a button assembly, a fastening frame, a circuit board, a casing, an outer shell and a top cover. The button assembly includes a pedestal, a pressure sensor module and a key cap. A middle of the pedestal has an accommodating groove penetrating upward through a top surface of the middle of the pedestal. Two opposite sides of the pedestal protrude oppositely outward to form a lower active portion and a lower pivot portion. The pressure sensor module is mounted in the accommodating groove of the pedestal. The key cap is covered on the pressure sensor module. A bottom surface of the key cap has a contact portion contacting with the pressure sensor module. Two opposite sides of the key cap protrude oppositely outward to form an upper active portion and an upper pivot portion, respectively. The upper active portion is movably fastened to the lower active portion to form a movable active assembly. The upper pivot portion and the lower pivot portion are pivotally fastened with each other to form a pivot assembly. In processes of pressing and releasing the key cap, the upper pivot portion rotate pivoting the lower pivot portion. The upper active portion of the active assembly moves downward and upward with respect to the lower active portion. The fastening frame is mounted under the button assembly. The circuit board is mounted under the fastening frame and the button assembly. The casing surrounds upward the circuit board, the fastening frame and the button assembly. The outer shell, the casing, the circuit board, the fastening frame and the button assembly are disposed in the outer shell. The top cover is assembled on the casing, and covers the button assembly, the fastening frame, the circuit board, the casing and the outer shell. A middle of the top cover opens an opening vertically penetrating through the top cover. The key cap is exposed outside from the opening.

Another object of the present invention is to provide a button assembly adapted for being mounted in a controller. The button assembly includes a pedestal, a pressure sensor module and a key cap. Two opposite sides of the pedestal protrude oppositely outward to form a lower active portion and a lower pivot portion. The pressure sensor module is mounted in the pedestal. A top of the pressure sensor module has a soft material sensor. The soft material sensor has an elasticity. The key cap is covered on the pressure sensor module. A bottom surface of the key cap has a contact portion contacting with the pressure sensor module. Two opposite sides of the key cap protrude oppositely outward to form an upper active portion and an upper pivot portion, respectively. The upper active portion is movable fastened to the lower active portion to form a movable active assembly.

The upper pivot portion and the lower pivot portion are pivotally fastened with each other to form a pivot assembly. In processes of pressing and releasing the key cap, the upper pivot portion rotate pivoting the lower pivot portion, the upper active portion of the active assembly move downward and upward with respect to the lower active portion. When the key cap is pressed, the soft material sensor shows a sunken status, the first protruding block passes through the active hole and the upper active portion moves downward along the first protruding block to make the upper active portion move downward, at the same time, the upper pivot portion rotates in the lower pivot portion to a pressing position, when the key cap is released, the soft material sensor will rebound upward to return to an original status so as to push upward the contact portion and make the upper active portion move upward along the first protruding block, the upper active portion is movably fastened to the lower active portion, so the upper active portion will generate an upward resilience force to make the pressed upper active portion of the key cap bounce upward to return to an original position, at the same time, the upper pivot portion rotates to the original position.

As described above, the button assembly is capable of being pressed by virtue of the pivot assembly and the movable active assembly being disposed among the pedestal, the pressure sensor module and the key cap, and the pressure sensor module and the key cap of the button assembly are assembled to form the combination module, the combination module is mounted on the pedestal, so that the button assembly reaches a modular requirement, the button assembly applied in the controller may be flexibly easily detected and changed in the other structures of which each is matched with the combination module. In addition, when the user presses the modular button assembly, a pressing force is transmitted to the pressure sensor module through the key cap, comparing the modular button assembly with a button assembly of the conventional controller, the modular button assembly has fewer accumulated tolerances and a higher sensing sensitivity in use.

BRIEF DESCRIPTION OF THE DRAWINGS

The present invention will be apparent to those skilled in the art by reading the following description, with reference to the attached drawings, in which.

DETAILED DESCRIPTION OF THE PREFERRED EMBODIMENT

Figure 1:
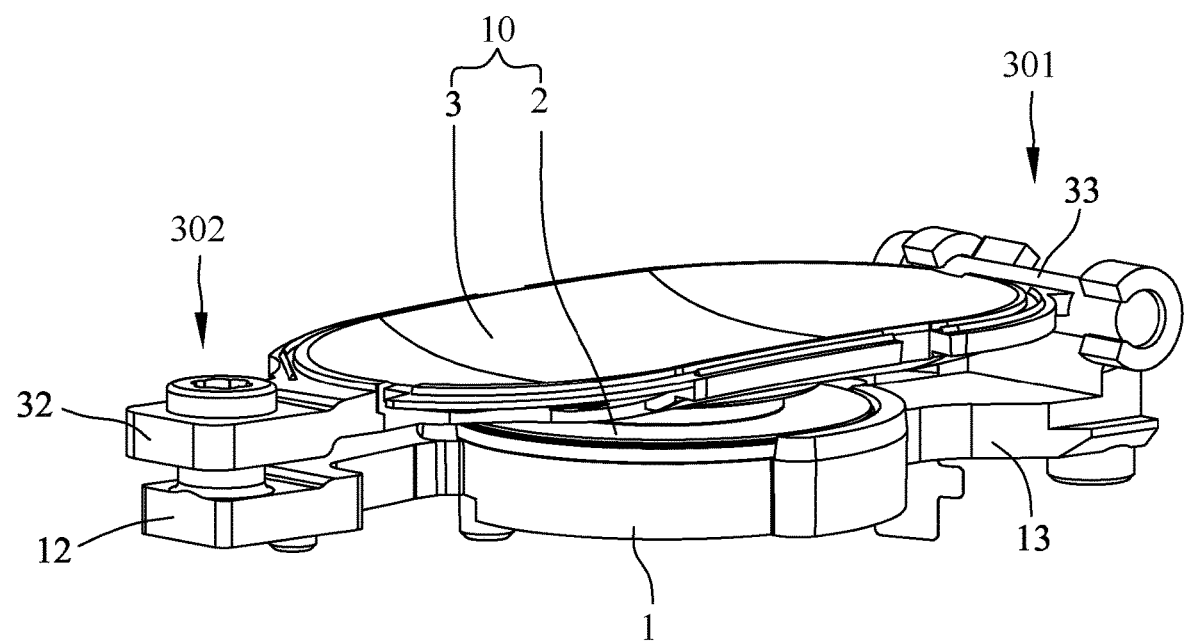
FIG. 1 is a perspective view of a button assembly in accordance with the present invention.
Figure 2:
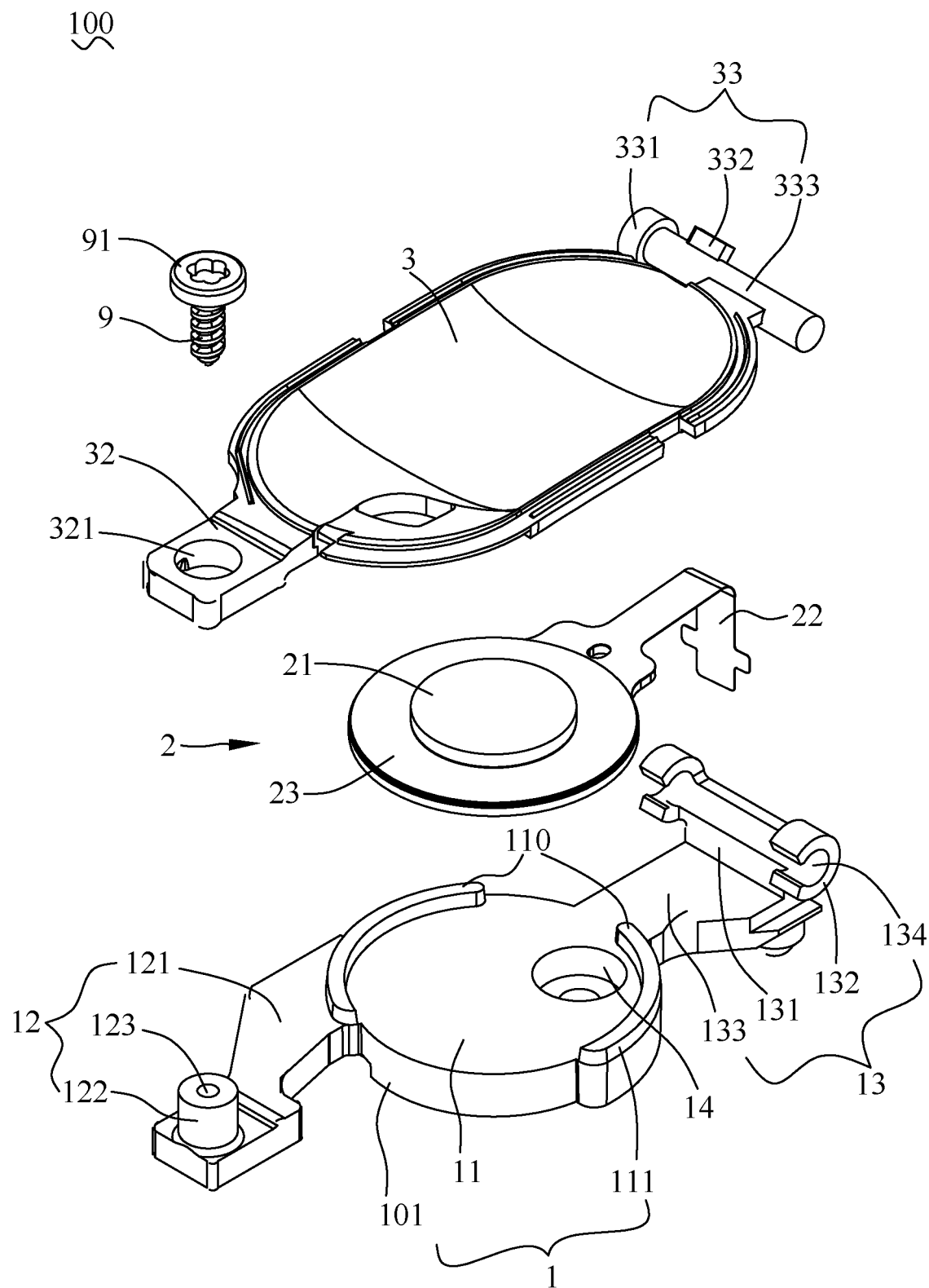
FIG. 2 is an exploded perspective view of the button assembly in accordance with the present invention.
Figure 3:
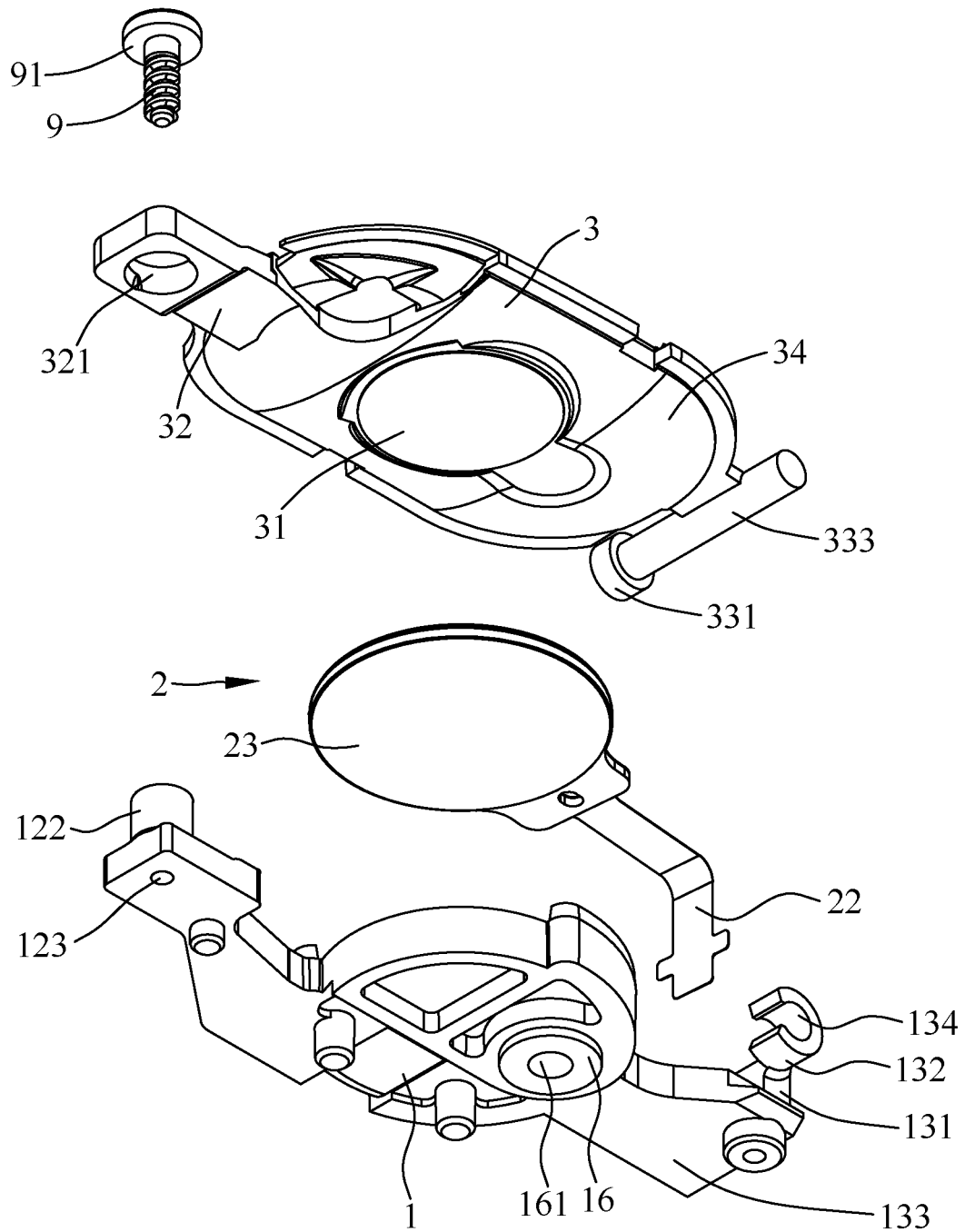
FIG. 3 is another exploded perspective view of the button assembly of the FIG. 2.
Figure 4:
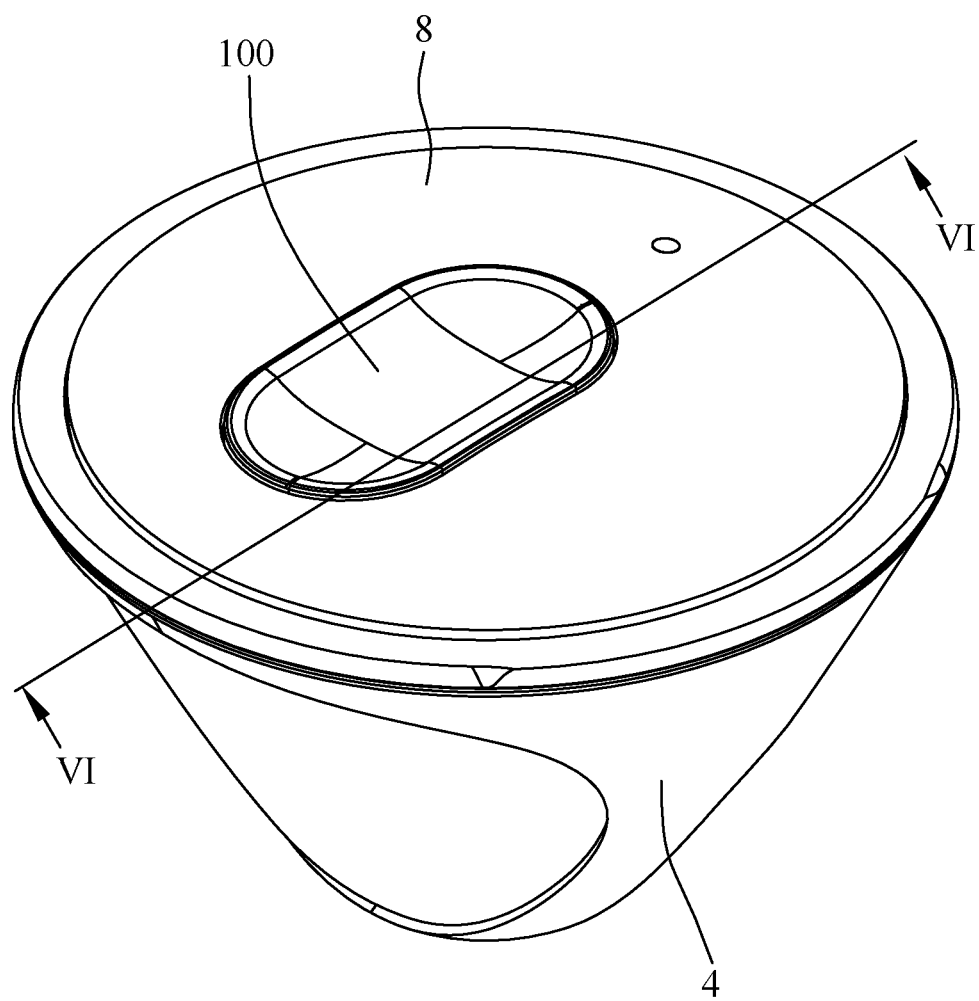
FIG. 4 is a perspective view of a controller equipped with the button assembly in accordance with the present invention.
Figure 5:
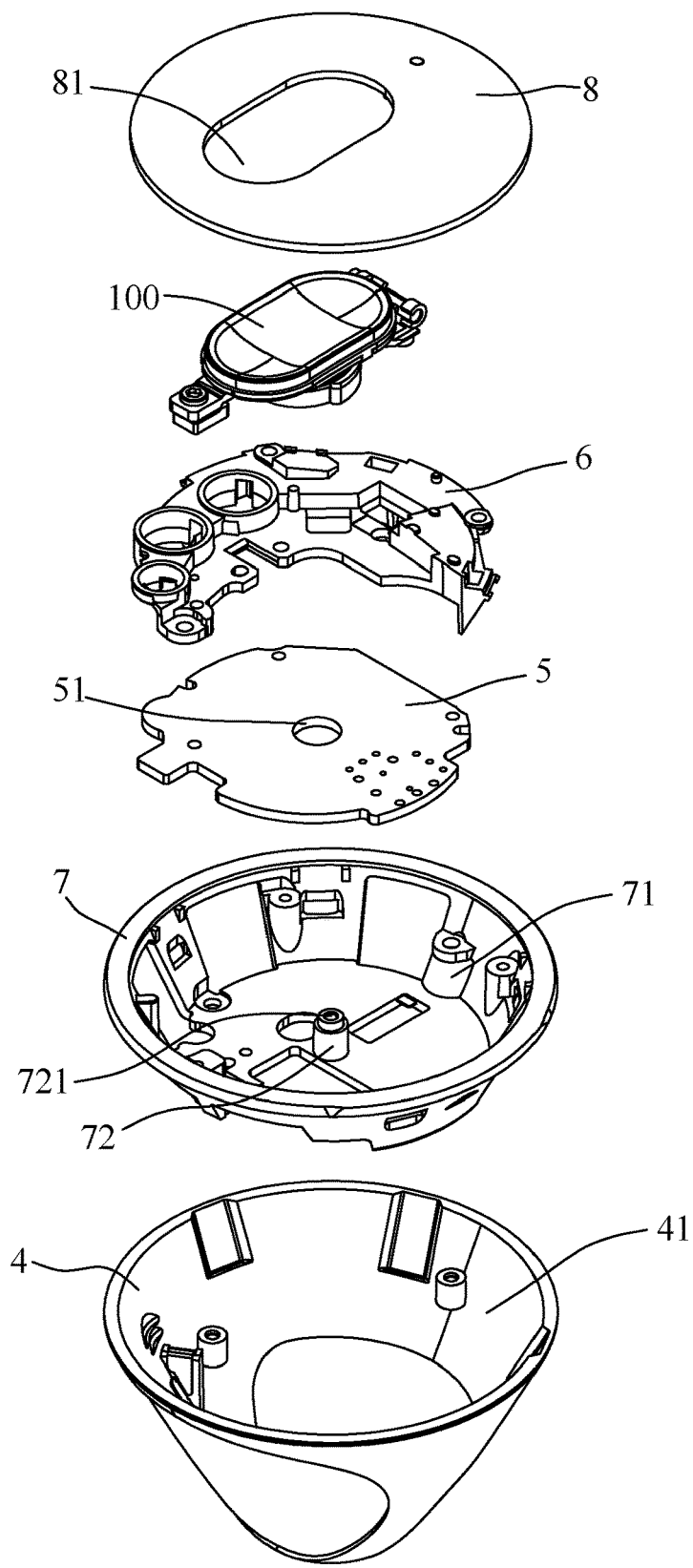
FIG. 5 is an exploded perspective view of the controller including the button assembly in accordance with the present invention.
Figure 6:
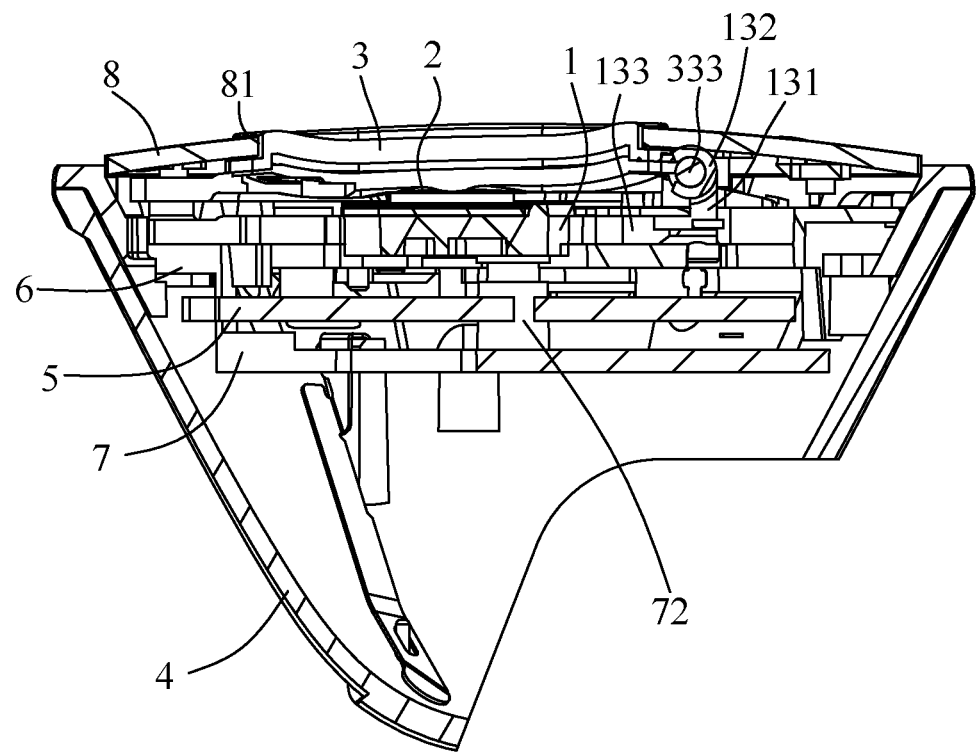
FIG. 6 is a cross-section view of the controller along a line VI-VI of FIG. 4.

With reference to FIG. 1 to FIG. 3, a button assembly 100 and a controller 200 in accordance with a preferred embodiment of the present invention are shown. The controller 200 includes the button assembly 100. The button assembly 100 adapted for being mounted in the controller 200, includes a pedestal 1, a pressure sensor module 2 and a key cap 3.

The pedestal 1 has a circular base portion 101. A peripheral surface of the base portion 101 of the pedestal 1 has a plurality of arc-shaped limiting blocks 111, so that a middle of the pedestal 1 has an accommodating groove 11 being opened at a top surface 110 of the middle of the pedestal 1 and the accommodating groove 11 is surrounded by the plurality of the limiting blocks 111. In the preferred embodiment, two opposite sides of the peripheral surface of the base portion 101 protrude outward and then extend upward to form two arc-shaped limiting blocks 111, so that the middle of the pedestal 1 has the accommodating groove 11 being opened at the top surface 110 of the middle of the pedestal 1 and surrounded by the two limiting blocks 111.

Two opposite sides of the base portion 101 of the pedestal 1 protrude oppositely outward to form a lower active portion 12 and a lower pivot portion 13. Two opposite sides of the pedestal 1 protrude oppositely outward to form the lower active portion 12 and the lower pivot portion 13. One side of the peripheral surface of the base portion 101 extend oppositely outward to form the lower active portion 12 connected with one side of an outer surface of the limiting block 111 away from the lower active portion 12. The lower active portion 12 has a lower extending portion 121 extending outward from one side of the base portion 101. A top surface of a tail end of the lower extending portion 121 of the lower active portion 12 protrudes upward to form a first protruding block 122. A top surface of the first protruding block 122 is recessed downward to form a locating hole 123 vertically penetrating through the first protruding block 122. The lower pivot portion 13 includes a connecting portion 133 protruded opposite to the lower active portion 12, and a lower limiting portion 131 protruded upward from a tail end of the connecting portion 133. Two opposite ends of the lower pivot portion 131 have two arc-shaped clamping portions 132. Mouths of the two clamping portions 132 facing the lower active portion 12. The two clamping portions 132 open two clamping grooves 134 penetrating through two sides of the two clamping portions 132 facing the lower active portion 12. The base portion 101 opens a fastening hole 14 vertically penetrating through the base portion 101. A bottom of the base portion 101 protrudes downward to form a hollow fixing pillar 16. A middle of the fixing pillar 16 opens a fixing hole 161 corresponding to a middle of the fastening hole 14 and communicated with the fastening hole 14.

The pressure sensor module 2 is mounted in the accommodating groove 11 of the pedestal 1. A top of the pressure sensor module 2 has a circular soft material sensor 21. The pressure sensor module 2 has a fastening portion 23, and a first capacitor 22 extended outward from one side of the fastening portion 23. The pressure sensor module 2 includes the circular soft material sensor 21 mounted on a middle of a top of the fastening portion 23.

With reference to FIG. 1 to FIG. 3, the key cap 3 is covered on the pressure sensor module 2. A middle of a bottom surface of the key cap 3 has a contact portion 31 contacting with the pressure sensor module 2. Two opposite sides of the key cap 3 protrude oppositely outward to form an upper active portion 32 and an upper pivot portion 33, respectively. The key cap 3 has an elliptical main portion 34. A middle of a bottom surface of the main portion 34 has the contact portion 31 matched with the soft material sensor 21. The contact portion 31 contacts with a top surface of the soft material sensor 21. The upper active portion 32 is corresponding to the tail end of the lower extending portion 121 of the lower active portion 12. One side of the main portion 34 protrudes outward to form the upper active portions 32 move downward and upward with respect to the lower active portion 12, the upper active portion 32 movably inserted downward into the first protruding block 122. The other side of the main portion 34 protrudes outward to form the upper pivot portion 33. The upper pivot portion 33 is disposed corresponding to the lower pivot portion 13. The upper pivot portion 33 is corresponding to the tail end of the connecting portion 133. The upper pivot portion 33 and the lower pivot portion 13 are pivotally fastened with each other to form a pivot assembly 301, when the upper active portion 32 moves downward or upward, the upper pivot portion 33 will rotate in the lower limiting portion 131.

The upper active portion 32 opens an active hole 321 vertically penetrating through the upper active portion 32 and disposed corresponding to the first protruding block 122. The button assembly 100 further includes a fixing element 9. A top portion of the fixing element 9 has a nut 91. The nut 91 of the fixing element 9 is positioned on a peripheral wall of the locating hole 123 and abuts against a top surface of the upper active portion 32, so that the upper active portion 32 is limited between the lower active portion 12 and the fixing element 9, and the upper active portion 32 is capable of moving downward and upward by virtue of the first protruding block 122 of the lower active portion 12 passing through the active hole 321. The upper active portion 32 is movably fastened to a tail end of the lower active portion 12 to form a movable active assembly 302. A diameter of the nut 91 is larger than a diameter of the active hole 321, so when the upper active portion 32 and the lower active portion 12 form the movable active assembly 302, the upper active portion 32 is capable of moving downward and upward with respect to the lower active portion 12, the upper active portion 32 has no way of breaking away from the lower active portion 12 by virtue of the upper active portion 32 being blocked by the nut 91 of the fixing element 9.

One end of the upper pivot portion 33 has a first limiting block 331, and the other end of the upper pivot portion 33 has a rotation shaft 333 connected with a middle of a front surface of the first limiting block 331. The rotation shaft 333 is disposed in and rotatable in the two clamping grooves 134. The upper pivot portion 33 further has a second limiting block 332 disposed at one side of the rotation shaft 333 and near the first limiting block 331. When the upper pivot portion 33 is assembled to the lower pivot portion 13, the upper pivot portion 33 are fixed in the two clamping grooves 134 of the two clamping portions 132. Simultaneously, the first limiting block 331 abuts against a rear surface of one clamping portion 132, and the second limiting block 332 abuts against a front surface of the one clamping portion 132, so that, the one clamping portion 132 is limited between the first limiting block 331 and the second limiting block 332 to limit the upper pivot portion 33 in the two clamping portions 132 of the lower limiting portion 131. In processes of pressing and releasing the key cap 3, the upper pivot portion 33 rotates pivoting the lower pivot portion 13, the upper active portion 32 of the movable active assembly 302 moves downward and upward with respect to the lower active portion 12, and the upper pivot portion 33 of the pivot assembly 301 rotates in the lower limiting portion 131.

Because the button assembly 100 uses the soft material sensor 21, a sensing sensitivity of the pressure sensor module 2 is higher than sensing sensitivities of a flexible printed circuit board and a pressure sensing component by virtue of the soft material sensor 21. When a user presses the pressure sensor module 2 of the button assembly 100, pressure values are easily caused to be overly changed, so the pressure sensor module 2 of the button assembly 100 in accordance with the present invention is assembled in and between the pedestal 1 and the key cap 3. When the key cap 3 of the button assembly 100 is pressed by the user, the soft material sensor 21 shows a sunken status, the first protruding block 122 passes through the active hole 321 and the upper active portion 32 moves downward along the first protruding block 122 to make the upper active portion 32 move downward, at the same time, the upper pivot portion 33 rotates in the lower limiting portion 131 of the lower pivot portion 13 to a pressing position, so that the user proceeds with a downward pressed action on the key cap 3.

Specifically, because the soft material sensor 21 has an elasticity, when the user presses a portion of the key cap 3, a part of the soft material sensor 21 corresponding to the portion of the key cap 3 is pressed downward by the key cap 3, at the moment, the part of the soft material sensor 21 corresponding to the portion of the key cap 3 will generate a sunken area on account of the soft material sensor 21 bearing a force exerted by the key cap 3, at the moment, the sunken area of the soft material sensor 21 will generate an upward resilience due to the elasticity of the soft material sensor 21. When the user presses a portion of the main portion 34 of the key cap 3, a portion of the soft material sensor 21 corresponding to the portion of the main portion 34 of the key cap 3 is pressed downward by the key cap 3, at the moment, the portion of the soft material sensor 21 corresponding to the portion of the main portion 34 of the key cap 3 will generate the sunken area on account of the soft material sensor 21 bearing the force exerted by the key cap 3, at the moment, the sunken area of the soft material sensor 21 will generate the upward resilience due to the elasticity of the soft material sensor 21.

When the key cap 3 of the button assembly 100 is released by the user, the soft material sensor 21 which shows the sunken status will rebound upward to return to an original status so as to push upward the contact portion 31 and make the upper active portion 32 move upward along the first protruding block 122, the upper active portion 32 is movably fastened to the tail end of the lower active portion 12, so the upper active portion 32 will generate an upward resilience force to make the pressed upper active portion 32 of the key cap 3 bounce upward to return to an original position, at the same time, the upper pivot portion 33 rotates to the original position. At the moment, the top surfaces of the upper active portion 32 abut against the nut 91 of the fixing element 9 for offsetting the upward resilience generated by the soft material sensor 21 to steadily maintain the key cap 3 in the initial status, and a pressing action of the key cap 3 is completed. Thus the user may steadily press the pressure sensor module 2 at the time of the user pressing the button assembly 100.

With reference to FIG. 1 to FIG. 6, a button assembly 100 in accordance with the present invention is applied in the controller 200. The controller 200 includes an outer shell 4, a circuit board 5, a fastening frame 6, a casing 7 and a top cover 8. The button assembly 100 is assembled in the controller 200.

The outer shell 4 is of a substantially hollow circular cone shape. A top and a lower portion of one side of the outer shell 4 is opened freely and communicated with an outside. The outer shell 4 has a first accommodating space 41 penetrating through the top of the outer shell 4 and communicated with the outside. The fastening frame 6 is mounted on the circuit board 5. The fastening frame 6 is mounted under the button assembly 100. The circuit board 5 is mounted under the fastening frame 6 and the button assembly 100. The circuit board 5 has a connecting hole 51. A bottom surface of the circuit board 5 is equipped with a second capacitor (not shown).

The casing 7 is of a hollow basin shape. A top of the casing 7 is opened freely and is covered by the top cover 8. The casing 7 has a second accommodating space 71 penetrating through the top of the casing 7. An inner surface of a bottom of the casing 7 protrudes upward to form a protruding pillar 72. A middle of the protruding pillar 72 is recessed downward to form a fastening groove 721 corresponding to the fastening hole 14 of the pedestal 1 of the button assembly 100. The circuit board 5 and the fastening frame 6 together with the button assembly 100 are disposed in the casing 7, so the casing 7 surrounds upward the circuit board 5, the fastening frame 6 and the button assembly 100. The pedestal 1 of the button assembly 100 is assembled in the casing 7. The casing 7, the circuit board 5, the fastening frame 6 and the button assembly 100 are disposed in the first accommodating space 41 of the outer shell 4. The casing 7 is exposed out of the outer shell 4 from the top of the outer shell 4.

The fixing hole 161 and the middle of the fastening hole 14 of the pedestal 1 are corresponding to the fastening groove 721. The controller 200 further includes a fastening element (not shown). The fixing pillar 16 and the protruding pillar 72 pass through the connecting hole 51 and are corresponding to each other. The fastening element passes through and is fastened in the fastening hole 14, the fixing hole 161 and the fastening groove 721 of the protruding pillar 72. A tail end of the first capacitor 22 is connected with the second capacitor of the circuit board 5. The top cover 8 is assembled on the casing 7, and covers the button assembly 100, the fastening frame 6, the circuit board 5, the casing 7 and the outer shell 4. A middle of the top cover 8 opens an elliptical opening 81 vertically penetrating through the top cover 8. The opening 81 of the top cover 8 is disposed corresponding to the button assembly 100. Specifically, the opening 81 is corresponding to the key cap 3. The key cap 3 is exposed outside from the opening 81. So that the button assembly 100 is assembled in the controller 200.

The pressure sensor module 2 and the key cap 3 of the button assembly 100 are assembled to form a combination module 10. The combination module 10 is mounted on the pedestal 1. The combination module 10 is capable of being assembled to other structures of which each is matched with the combination module 10, so the button assembly 100 in accordance with the present invention is without being limited to the above-mentioned detailed description disclosed in the preferred embodiment.

As described above, the button assembly 100 is capable of being pressed by virtue of the pivot assembly 301 and the movable active assembly 302 being disposed among the pedestal 1, the pressure sensor module 2 and the key cap 3, and the pressure sensor module 2 and the key cap 3 of the button assembly 100 are assembled to form the combination module 10, the combination module 10 is mounted on the pedestal 1, so that the button assembly 100 reaches a modular requirement, the button assembly 100 applied in the controller 200 may be flexibly easily detected and changed in the other structures of which each is matched with the combination module 10. In addition, when the user presses the modular button assembly 100, a pressing force is transmitted to the pressure sensor module 2 through the key cap 3, comparing the modular button assembly 100 with a button assembly of the conventional controller, the modular button assembly 100 has fewer accumulated tolerances and a higher sensing sensitivity in use.

What is claimed is:

1. A button assembly adapted for being mounted in a controller, comprising:
a pedestal, a middle of the pedestal having an accommodating groove being opened at a top surface of the middle of the pedestal, two opposite sides of the pedestal protruding oppositely outward to form a lower active portion and a lower pivot portion;
a pressure sensor module mounted in the accommodating groove of the pedestal; and
a key cap covering the pressure sensor module, a bottom surface of the key cap having a contact portion contacting the pressure sensor module, two opposite sides of the key cap protruding oppositely outward to form an upper active portion and an upper pivot portion, respectively, the upper active portion being movably fastened to the lower active portion to form a movable active assembly, the upper pivot portion and the lower pivot portion being pivotally fastened with each other to form a pivot assembly, when pressing and releasing the key cap, the upper pivot portion rotates in the lower pivot portion, the upper active portion of the active assembly moves downward and upward with respect to the lower active portion;
wherein the pedestal has a base portion, the lower pivot portion includes a connecting portion protruded opposite to the lower active portion, and a lower limiting portion protruded upward from a tail end of the connecting portion, two opposite ends of the lower pivot portion have two arc-shaped clamping portions, the two clamping portions include two clamping grooves penetrating through two sides of the two clamping portions facing the lower active portion, the upper pivot portion is disposed corresponding to the lower pivot portion, one end of the upper pivot portion has a first limiting block, an other end of the upper pivot portion has a rotation shaft connected with a middle of a front surface of the first limiting block, the rotation shaft is disposed in and rotatable in the two clamping grooves, the upper pivot portion further has a second limiting block disposed at one side of the rotation shaft and near the first limiting block, the upper pivot portion is fixed in the two clamping grooves of the two clamping portions, the first limiting block abuts against a rear surface of one clamping portion, and the second limiting block abuts against a front surface of the one clamping portion.

2. The button assembly as claimed in claim 1, wherein the lower active portion has a lower extending portion extending outward from one side of the base portion, the upper active portion corresponds to a tail end of the lower extending portion of the lower active portion, the upper pivot portion corresponds to the tail end of the connecting portion, the key cap has a main portion, a top surface of a tail end of the lower extending portion protrudes upward to form a first protruding block, the upper active portion includes an active hole corresponding to the first protruding block, the first protruding block passes through the active hole.

3. The button assembly as claimed in claim 2, wherein a top surface of the first protruding block is recessed downward to form a locating hole vertically penetrating through the first protruding block, the button assembly further includes a fixing element, a nut of the fixing element is positioned on a peripheral wall of the locating hole and abuts against a top surface of the upper active portion, the upper active portion is limited between the lower active portion and the fixing element.

4. The button assembly as claimed in claim 1, wherein a top of the pressure sensor module has a soft material sensor, a middle of the bottom surface of the key cap has the contact portion, the contact portion contacts a top surface of the soft material sensor, when the key cap is pressed, the soft material sensor shows a sunken status, a first protruding block passes through an active hole and the upper active portion moves downward along the first protruding block to make the upper active portion move downward, at the same time, the upper pivot portion rotates in the lower pivot portion to a pressing position, when the key cap is released, the soft material sensor will rebound upward to return to an original status so as to push upward the contact portion and make the upper active portion move upward along the first protruding block, at the same time, the upper pivot portion rotates to an original position.

5. The button assembly as claimed in claim 1, wherein a peripheral surface of the base portion of the pedestal has a plurality of limiting blocks, the middle of the pedestal has the accommodating groove penetrating upward through a top surface of the middle of the pedestal and surrounded by the plurality of limiting blocks.

6. The button assembly as claimed in claim 1, wherein the pressure sensor module has a fastening portion, and the pressure sensor module includes a soft material sensor mounted on a top of the fastening portion.

7. The button assembly as claimed in claim 6, wherein the soft material sensor has an elasticity.

8. A controller, comprising:
a button assembly, including:
a pedestal, a middle of the pedestal having an accommodating groove being opened at a top surface of the middle of the pedestal, two opposite sides of the pedestal protruding oppositely outward to form a lower active portion and a lower pivot portion;
a pressure sensor module mounted in the accommodating groove of the pedestal; and
a key cap covering the pressure sensor module, a bottom surface of the key cap having a contact portion contacting the pressure sensor module, two opposite sides of the key cap protruding oppositely outward to form an upper active portion and an upper pivot portion, respectively, the upper active portion being movably fastened to the lower active portion to form a movable active assembly, the upper pivot portion and the lower pivot portion being pivotally fastened with each other to form a pivot assembly, when pressing and releasing the key cap, the upper pivot portion rotates in the lower pivot portion, the upper active portion of the active assembly moves downward and upward with respect to the lower active portion;
a fastening frame mounted under the button assembly;
a circuit board mounted under the fastening frame and the button assembly;
a casing surrounding the circuit board, the fastening frame and the button assembly;
an outer shell, wherein the casing, the circuit board, the fastening frame and the button assembly being disposed in the outer shell; and
a top cover assembled on the casing, and covering the button assembly, the fastening frame, the circuit board, the casing and the outer shell, a middle of the top cover including an opening vertically penetrating through the top cover, the key cap being exposed outside from the opening;
wherein the pedestal has a base portion, the lower pivot portion includes a connecting portion protruded opposite to the lower active portion, and a lower limiting portion protruded upward from a tail end of the connecting portion, two opposite ends of the lower pivot portion have two arc-shaped clamping portions, the two clamping portions include two clamping grooves penetrating through two sides of the two clamping portions facing the lower active portion, the upper pivot portion is disposed corresponding to the lower pivot portion, one end of the upper pivot portion has a first limiting block, an other end of the upper pivot portion has a rotation shaft connected with a middle of a front surface of the first limiting block, the rotation shaft is disposed in and rotatable in the two clamping grooves, the upper pivot portion further has a second limiting block disposed at one side of the rotation shaft and near the first limiting block, the upper pivot portion is fixed in the two clamping grooves of the two clamping portions, the first limiting block abuts against a rear surface of one clamping portion, and the second limiting block abuts against a front surface of the one clamping portion.

9. The controller as claimed in claim 8, wherein the lower active portion has a lower extending portion extending outward from one side of the base portion, the upper active portion corresponds to a tail end of the lower extending portion of the lower active portion, the upper pivot portion corresponds to the tail end of the connecting portion, the key cap has a main portion, a top surface of a tail end of the lower extending portion protrudes upward to form a first protruding block, the upper active portion includes an active hole corresponding to the first protruding block, the first protruding block passes through the active hole.

10. The controller as claimed in claim 9, wherein a top surface of the first protruding block is recessed downward to form a locating hole vertically penetrating through the first protruding block, the button assembly further includes a fixing element, a nut of the fixing element is positioned on a peripheral wall of the locating hole and abuts against a top surface of the upper active portion, the upper active portion is limited between the lower active portion and the fixing element.

11. The controller as claimed in claim 8, wherein a top of the pressure sensor module has a soft material sensor, a middle of the bottom surface of the key cap has the contact portion, the contact portion contacts a top surface of the soft material sensor, when the key cap is pressed, the soft material sensor shows a sunken status, a first protruding block passes through an active hole and the upper active portion moves downward along the first protruding block to make the upper active portion move downward, at the same time, the upper pivot portion rotates in the lower pivot portion to a pressing position, when the key cap is released, the soft material sensor will rebound upward to return to an original status so as to push upward the contact portion and make the upper active portion move upward along the first protruding block, at the same time, the upper pivot portion rotates to an original position.

12. The controller as claimed in claim 8, wherein a peripheral surface of the base portion of the pedestal has a plurality of limiting blocks, a middle of the pedestal has the accommodating groove penetrating upward through a top surface of the middle of the pedestal and surrounded by the plurality of limiting blocks.

13. The controller as claimed in claim 8, further comprising a fastening element, the base portion including a fastening hole vertically penetrating through the base portion, a bottom of the base portion protruding downward to form a hollow fixing pillar, a middle of the fixing pillar including a fixing hole corresponding to a middle of the fastening hole and communicated with the fastening hole, an inner surface of a bottom of the casing protruding upward to form a protruding pillar, a middle of the protruding pillar being recessed downward to form a fastening groove corresponding to the fastening hole, the fastening element passing through and being fastened in the fastening hole, the fixing hole and the fastening groove of the protruding pillar.

14. The controller as claimed in claim 8, wherein the pressure sensor module has a fastening portion, and the pressure sensor module includes a soft material sensor mounted on a top of the fastening portion.

15. The controller as claimed in claim 14, wherein the soft material sensor has an elasticity.

16. The controller as claimed in claim 8, wherein the pressure sensor module has a fastening portion, and a first capacitor extended outward from one side of the fastening portion, a tail end of the first capacitor is connected with the circuit board.

17. A button assembly adapted for being mounted in a controller, comprising:
   a pedestal, two opposite sides of the pedestal protruding oppositely outward to form a lower active portion and a lower pivot portion;
   a pressure sensor module mounted in the pedestal, the pressure sensor module has a fastening portion, and a first capacitor extended outward from one side of the fastening portion, a tail end of the first capacitor is connected with a circuit board, a top of the pressure sensor module having a soft material sensor, the soft material sensor having an elasticity; and
   a key cap covering the pressure sensor module, a bottom surface of the key cap having a contact portion contacting the pressure sensor module, two opposite sides of the key cap protruding oppositely outward to form an upper active portion and an upper pivot portion, respectively, the upper active portion being movably fastened to the lower active portion to form a movable active assembly, the upper pivot portion and the lower pivot portion being pivotally fastened with each other to form a pivot assembly, when pressing and releasing the key cap, the upper pivot portion rotates in the lower pivot portion, the upper active portion of the active assembly moves downward and upward with respect to the lower active portion;
   wherein when the key cap is pressed, the soft material sensor shows a sunken status, a first protruding block passes through an active hole and the upper active portion moves downward along the first protruding block to make the upper active portion move downward, at the same time, the upper pivot portion rotates in the lower pivot portion to a pressing position, when the key cap is released, the soft material sensor will rebound upward to return to an original status so as to push upward the contact portion and make the upper active portion move upward along the first protruding block, at the same time, the upper pivot portion rotates to an original position.

18. The button assembly as claimed in claim 17, wherein the pedestal has a base portion, two opposite sides of the base portion protruding oppositely outward to form the lower active portion and the lower pivot portion, a peripheral surface of the base portion of the pedestal has a plurality of limiting blocks, a middle of the pedestal has an accommodating groove surrounded by the plurality of limiting blocks, the pressure sensor module is mounted in the accommodating groove.

\* \* \* \* \*